United States Patent
Zhang et al.

(10) Patent No.: US 9,998,278 B2
(45) Date of Patent: Jun. 12, 2018

(54) METHOD AND APPARATUS FOR SYNCHRONIZATION OF A DECODING UNIT

(71) Applicant: Rohde & Schwarz GmbH & Co. KG, Munich (DE)

(72) Inventors: Joe Zhang, Lake Oswego, OR (US); Armin Horn, Newberg, OR (US)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 69 days.

(21) Appl. No.: 14/846,862

(22) Filed: Sep. 7, 2015

(65) Prior Publication Data

US 2017/0068590 A1    Mar. 9, 2017

(51) Int. Cl.
| | |
|---|---|
| *H04L 7/04* | (2006.01) |
| *H03M 13/33* | (2006.01) |
| *H04L 1/00* | (2006.01) |
| *H04L 7/00* | (2006.01) |

(52) U.S. Cl.
CPC .......... *H04L 7/048* (2013.01); *H03M 13/33* (2013.01); *H04L 1/0061* (2013.01); *H04L 1/0078* (2013.01); *H04L 1/0091* (2013.01); *H04L 7/00* (2013.01)

(58) Field of Classification Search
CPC ................................ H04L 7/048; H03M 13/33
See application file for complete search history.

(56) References Cited

U.S. PATENT DOCUMENTS

| | | | | |
|---|---|---|---|---|
| 3,761,891 A * | 9/1973 | Markwitz | ............... | H04L 7/048 714/789 |
| 4,456,957 A * | 6/1984 | Schieltz | ................. | G06Q 40/02 370/475 |
| 4,596,981 A * | 6/1986 | Ueno | ...................... | H04L 7/042 370/514 |
| 4,757,518 A * | 7/1988 | Lagadec | ............ | G11B 20/1262 370/472 |
| 4,876,698 A * | 10/1989 | Boisson | .................. | H03M 7/42 348/466 |
| 4,878,232 A * | 10/1989 | Fisher | .................... | H04B 3/235 370/286 |
| 5,321,754 A * | 6/1994 | Fisher | ................... | H04L 1/0061 375/367 |

(Continued)

OTHER PUBLICATIONS

"IEEE Standard 1355-1995, Standard for Heterogeneous InterConnect (HIC), (Low Cost Low Latencey Scalable Serial Interconnect) (aka ISO/IEC 14575 DIS))," http://grouper.ieee.org/groups/1355, pp. 1-6 (Oct. 30, 1998).

*Primary Examiner* — Joseph D Torres
(74) *Attorney, Agent, or Firm* — Shumaker & Sieffert, P.A.

(57) ABSTRACT

An apparatus and method for synchronization of a decoding unit to a received data bit stream, DBS, encoded according to a data protocol, DP, said apparatus comprising a sampling unit adapted to sample a bit sequence, BSEQ, having a predetermined bit sequence length, BSEQL, from the received data bit stream, DBS, and a checking unit configured to check whether at least one specific bit of the sampled bit sequence, BSEQ, fulfills a predetermined error detection condition, EDC, defined by said data protocol, DP, and further configured to synchronize the decoding unit to the received data bit stream, DBS, if the checking result is positive.

22 Claims, 4 Drawing Sheets

(56) References Cited

U.S. PATENT DOCUMENTS

| | | | | |
|---|---|---|---|---|
| 5,506,847 | A | * | 4/1996 | Shobatake .......... H04L 12/2801 370/338 |
| 5,524,213 | A | * | 6/1996 | Dais .................... H04L 12/4135 370/462 |
| 5,790,607 | A | * | 8/1998 | Burke .................. H04L 7/0334 370/503 |
| 6,072,344 | A | * | 6/2000 | Larsson ................ H04L 7/041 327/156 |
| 6,089,749 | A | * | 7/2000 | Blaum .................. H03M 13/00 714/789 |
| 6,333,708 | B1 | * | 12/2001 | Hungerbuehler ......... G06F 5/00 341/155 |
| 6,363,514 | B1 | * | 3/2002 | Kawai .............. G11B 20/10527 714/701 |
| 6,510,013 | B1 | * | 1/2003 | Oshio ............. G11B 20/10009 331/18 |
| 6,968,480 | B1 | * | 11/2005 | Yuan ....................... H04L 7/048 714/700 |
| 7,278,071 | B2 | * | 10/2007 | Budde ................. H04L 25/4904 714/708 |
| 2004/0086034 | A1 | * | 5/2004 | Jungerman ............. H04L 1/203 375/224 |
| 2007/0230614 | A1 | * | 10/2007 | Walker ................ G06F 13/4295 375/296 |
| 2009/0319866 | A1 | * | 12/2009 | Antonakopoulos .... G11B 20/18 714/762 |
| 2011/0154171 | A1 | * | 6/2011 | Tran ................. G01R 31/31716 714/819 |

* cited by examiner

METHOD AND APPARATUS FOR SYNCHRONIZATION OF A DECODING UNIT

TECHNICAL BACKGROUND

The invention relates to a method and apparatus for synchronization of a decoding unit to a received data bit stream encoded according to a predetermined data protocol.

A communication data protocol allows two or more entities of a communication system to communicate between them to transmit a data stream via a physical communication channel. Data protocols may be implemented by hardware or software elements. Communication systems use predefined data formats and data protocols for exchanging messages. The transferred information or data is normally transported in encoded form. A data source encodes the data according to the used data protocol and the encoded data is then transmitted via the physical communication channel to a receiving unit where the received data bit stream is decoded by a decoding unit as defined by the data protocol. The data source or transmitter can send or transmit a long stream of continuous data via the communication channel to the receiving unit. The received data stream of some data protocol is continuous and does not comprise gaps which may be used for synchronization of the decoding unit of the receiving unit. Most data protocols use predetermined synchronization patterns which can be detected on the receiving side by a detection unit for synchronization, however, these synchronization patterns may be sent only rarely so that the synchronization on the receiving side takes long and transmitted data bits of the data bit stream received by the receiving unit before successful synchronization cannot be decoded and get lost.

Accordingly, there is a need for a method and apparatus for fast and reliable synchronization of a decoding unit to a received data bit stream.

SUMMARY OF THE INVENTION

The invention provides according to a first aspect a method for synchronization of a decoding unit to a received data bit stream encoded according to a data protocol,
the method comprising the steps of:
sampling a bit sequence having a predetermined bit sequence length from the received data bit stream,
checking whether at least one specific bit of the sampled bit sequence fulfills a predetermined error detection condition defined by said data protocol and
synchronizing the decoding unit to the received data bit stream according to the checking result.

In a possible embodiment of the method according to the first aspect of the present invention, beginning with the first bit of the sampled bit sequence every n-th data bit of the bit sequence is checked as to whether it fulfills the predetermined error detection condition defined by the data protocol, wherein n is the number of data bits of a data protocol character defined by the respective data protocol.

In a possible embodiment of the method according to the first aspect of the present invention, the error detection condition comprises a parity error detection condition defined by the data protocol.

In a further possible embodiment of the method according to the first aspect of the present invention, the used data protocol comprises a continuous serial data transfer protocol.

In a further possible embodiment of the method according to the first aspect of the present invention, the received data bit stream comprises a spacewire data bit stream encoded according to the spacewire data protocol.

In a further possible embodiment of the method according to the first aspect of the present invention, the data protocol characters defined by the data protocol comprise different types of data protocol characters.

In a still further possible embodiment of the method according to the first aspect of the present invention, a first type of data protocol characters comprises control characters consisting of a first number of data bits and a second type of data protocol characters comprises data characters consisting of a second number of data bits.

In a still further possible embodiment of the method according to the first aspect of the present invention, checking of every n-th data bit of the sampled bit sequence is repeated iteratively in a sequence of iteration steps as long as the checked n-th data bit fulfills the predetermined error detection condition defined by the data protocol.

In a further possible embodiment of the method according to the first aspect of the present invention, the number of check iteration steps is counted.

In a further possible embodiment of the method according to the first aspect of the present invention, if the number of counted check iteration steps reaches a predetermined threshold value, a sequence of valid data protocol characters within the sampled bit sequence is detected.

In a further possible embodiment of the method according to the first aspect of the present invention, the decoding unit is synchronized to the detected sequence of valid data protocol characters if a current synchronization confidence level reaches a set synchronization confidence level.

In a further possible embodiment of the method according to the first aspect of the present invention, the decoding unit decodes the received data bit stream after its synchronization in a decoding process comprising one or several decoding process steps defined by the data protocol.

In a further possible embodiment of the method according to the first aspect of the present invention, the current synchronization confidence level is calculated by a checking unit as follows:

$$\text{Synchronization level}(SYNC-CL) = \frac{2^N - 1}{2^N},$$

wherein N is the number of valid data protocol characters detected in N successful check iteration steps.

In a further possible embodiment of the method according to the first aspect of the present invention, the current synchronization confidence level is output by the checking unit, internally to a higher protocol layer of a protocol stack and/or to a comparator adapted to enable the decoding unit and/or via an output data interface to a control unit.

In a further possible embodiment of the method according to the first aspect of the present invention, the sampled bit sequence of the received data bit stream is stored in a data memory and read from the data memory by a checking unit which checks whether at least one specific bit of the sampled bit sequence fulfills the predetermined error detection condition defined by the respective data protocol.

In a further possible embodiment of the method according to the first aspect of the present invention, the data protocol is selected by a user or by a control unit from a predetermined group of available data protocols.

The invention further provides according to a second aspect an apparatus for synchronization of the decoding unit to a received data bit stream encoded according to a data protocol, said apparatus comprising:

a sampling unit adapted to sample a bit sequence having a predetermined bit sequence length from the received data bit stream and a checking unit configured to check whether at least one specific bit of the sampled bit sequence fulfills a predetermined error detection condition defined by the data protocol and further configured to synchronize the decoding unit to the received data bit stream if the checking result is positive.

In a further possible embodiment of the apparatus according to the second aspect of the present invention, the checking unit is configured to check beginning with a first bit of the sampled bit sequence every n-th data bit of the bit sequence as to whether it fulfills the predetermined error detection condition defined by the data protocol, wherein n is the number of data bits of a data protocol character defined by the data protocol.

In a further possible embodiment of the apparatus according to the second aspect of the present invention, the received data bit stream comprises a spacewire data bit stream encoded according to the spacewire data protocol.

In a further possible embodiment of the apparatus according to the second aspect of the present invention, the data protocol characters of the spacewire data protocol comprise different types of data protocol characters, wherein a first type of data protocol characters comprises control characters consisting of a first number of data bits and a second type of data protocol characters comprises data characters consisting of a second number of data bits.

In a further possible embodiment of the apparatus according to the second aspect of the present invention, the checking unit is configured to repeat iteratively in a sequence of iteration steps the checking of every n-th data bit of the sampled bit sequence as long as the checked n-th data bit fulfills the predetermined error detection condition defined by the data protocol.

In a further possible embodiment of the apparatus according to the second aspect of the present invention, the checking unit comprises a counter which is configured to count the number of check iteration steps.

In a further possible embodiment of the apparatus according to the second aspect of the present invention, the checking unit is adapted to detect a sequence of N valid data protocol characters within the sampled bit sequence if the number N of counted check iteration steps counted by the counter of the checking unit reaches a predetermined threshold value.

In a further possible embodiment of the apparatus according to the second aspect of the present invention, the decoding unit is synchronized to the detected sequence of valid data protocol characters if a current synchronization confidence level reaches a set synchronization confidence level.

In a still further possible embodiment of the apparatus according to the second aspect of the present invention, the checking unit is configured to calculate the current synchronization confidence level as follows:

$$\text{Synchronization confidence level}(SYNC - CL) = \frac{2^N - 1}{2^N},$$

wherein N is the number of valid data protocol characters detected in N successful check iteration steps performed by said checking unit.

In a further possible embodiment of the apparatus according to the second aspect of the present invention, the calculated current synchronization confidence level is output by said checking unit internally to a higher protocol layer of a protocol stack and/or to a comparator adapted to enable the decoding unit and/or via an output data interface to a control unit.

In a still further possible embodiment of the apparatus according to the second aspect of the present invention, the sampled bit sequence of the received data bit stream is stored in a data memory and read from said data memory by a checking unit which is configured to check whether at least one specific bit of the sampled bit sequence fulfills the predetermined error detection condition defined by said data protocol.

In a still further possible embodiment of the apparatus according to the second aspect of the present invention, the data protocol is selected by a user or by a control unit from a predetermined group of available stored data protocols.

The invention further provides according to a third aspect an oscilloscope comprising an apparatus for synchronization of a decoding unit of said oscilloscope to a received data bit stream encoded according to a predetermined data protocol and received by an inport of said oscilloscope, said synchronization apparatus of said oscilloscope comprising:

a sampling unit adapted to sample a bit sequence having a predetermined bit sequence length from the received data bit stream, and a checking unit configured to check whether at least one specific bit of the sampled bit sequence fulfills a predetermined error detection condition defined by said data protocol and further configured to synchronize the decoding unit of said oscilloscope to the received data bit stream if the checking result provided by said checking unit is positive.

In a possible embodiment of the oscilloscope according to the third aspect of the present invention, the oscilloscope further comprises an output unit configured to output the decoded bit stream and/or the calculated current synchronization confidence level output by the synchronization apparatus of said oscilloscope.

The invention further provides according to a fourth aspect a spacewire protocol decoder comprising a synchronization apparatus for synchronization of a decoding unit to a received data bit stream encoded according to a data protocol, said synchronization apparatus of said spacewire protocol decoder comprising:

a sampling unit adapted to sample a bit sequence having a predetermined bit sequence length from the received data bit stream, and a checking unit configured to check whether at least one specific bit of the sampled bit sequence fulfills a predetermined error detection condition defined by said spacewire data protocol and further configured to synchronize the decoding unit of the spacewire protocol decoder to the received data bit stream if the checking result provided by the checking unit is positive.

BRIEF DESCRIPTION OF THE FIGURES

In the following, possible embodiments of the different aspects of the present invention are described in more detail with reference to the enclosed figures. Similar reference signs represent similar or identical elements.

DETAILED DESCRIPTION OF EMBODIMENTS

Figure 1:
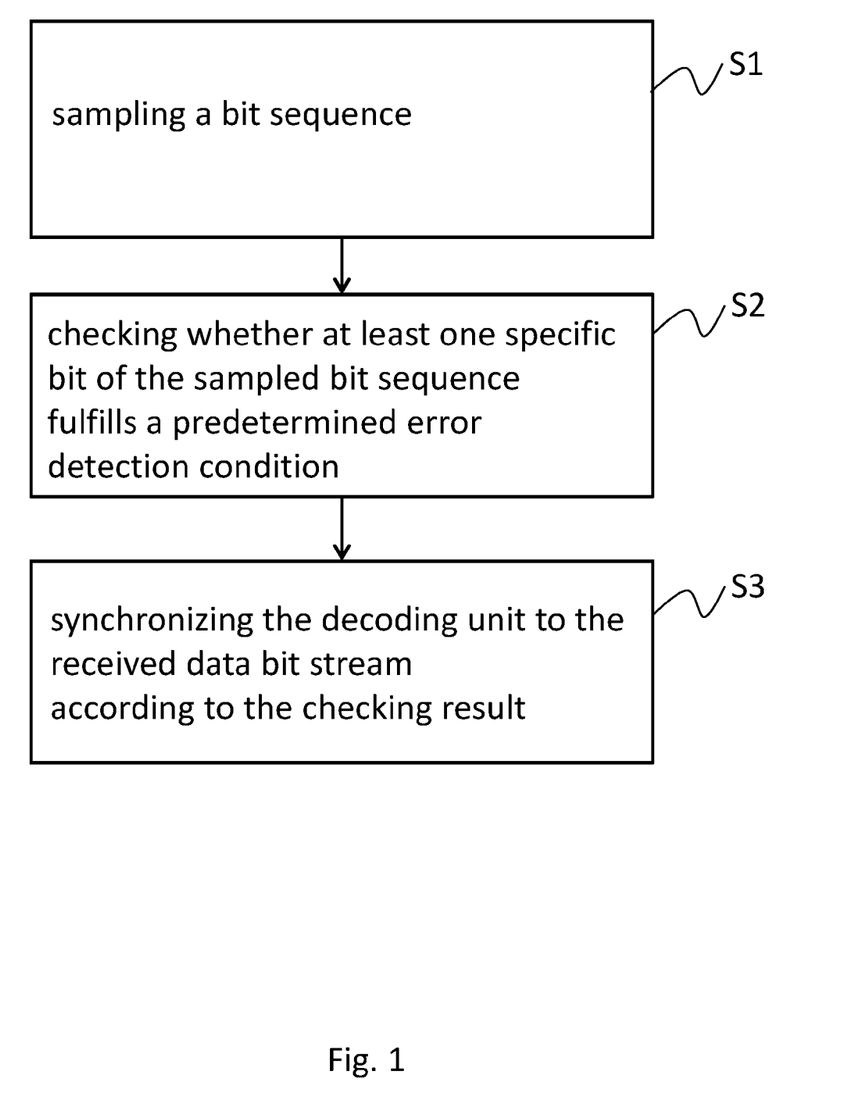
FIG. 1 shows a flowchart of a possible exemplary embodiment of a method for synchronization of a decoding unit according to the first aspect of the present invention.

As can be seen in the flowchart of FIG. 1, a method according to the first aspect of the present invention for synchronization of a decoding unit to a received data bit stream encoded according to a data protocol can comprise in an exemplary embodiment several steps.

In a first step S1, a bit sequence BSFQ having a predetermined bit sequence length BSEQL is sampled from the received data bit stream DBS. The length of the predetermined bit sequence length can vary depending on the application and used data protocol DP. In a possible embodiment, the bit sequence length BSEQL can be adjustable by a control unit or application of a higher protocol layer or by a user via a user interface. In a possible embodiment, the received data bit stream DBS is sampled in a memory unit or a data memory of a receiver wherein the memory unit comprises a memory size equal or greater than the predetermined bit sequence length BSEQL.

In a further step S2, it is checked whether at least one specific bit of the sampled bit sequence BSEQ which can be stored in the data memory fulfills a predetermined error detection condition EDC defined by the respective data protocol DP. In a possible embodiment, the error detection condition EDC can comprise a parity error detection condition PEDC predefined by the respective data protocol DP. In a possible implementation, the data protocol DP used for transferring the data bit stream DBS is known to the receiver. In an alternative embodiment, the data protocol DP can be selected from a group of available data protocols.

In a possible embodiment, beginning with the first bit of the sampled bit sequence BSEQ, every n-th data bit of the bit sequence is checked in step S2 as to whether it fulfills the predetermined error detection condition EDC defined by the respective data protocol DP, wherein n is the number of data bits of a data protocol character defined by the data protocol DP. In a possible embodiment, the used data protocol DP can comprise a continuous serial data transfer protocol. In a possible implementation of the method for synchronization of a decoding unit as illustrated in FIG. 1, the received data bit stream DBS can comprise a spacewire data bit stream encoded according to the spacewire data protocol SpWDP.

In a possible embodiment, the checking of every n-th data bit of the sampled bit sequence BSEQ in step S2 is repeated iteratively in a sequence of iteration steps as long as the checked n-th data bit fulfills the predetermined error detection condition EDC defined by the data protocol DP. In a possible implementation, the number of checked iteration steps is counted. If the number of counted checked iteration steps reaches a predetermined threshold value, a sequence of N valid data protocol characters DP-CH within the sampled bit sequence BSEQ is detected.

In a third step S3, the decoding unit is synchronized to the received data bit stream DBS according to the checking result provided in step S2. In a possible embodiment, the decoding unit of the receiver is synchronized to the detected sequence of valid data protocol characters DP-CH if a current synchronization confidence level SYNC-CL reaches a set readjusted synchronization confidence level. Then, the decoding unit of the receiver can decode the received data bit stream DBS after its synchronization in a decoding process comprising one or several decoding process steps defined by the respective data protocol DP.

In a possible embodiment, a current synchronization confidence level is calculated by a checking unit as follows:

$$SYNC-CL = \frac{2^N - 1}{2^N},$$

wherein N is the number of valid data protocol characters DP-CH detected in N successful check iteration steps. The calculated current synchronization confidence level SYNC-CL can be output in a possible embodiment by the checking unit internally to a higher protocol layer of a protocol stack. In a further possible embodiment, the calculated synchronization confidence level SYNC-CL can be output by the checking unit to a comparator, wherein the comparator is adapted to compare the received calculated current synchronization confidence level SYNC-CL with a predetermined set synchronization confidence level SET-SYNC-CL and to enable the decoding unit for decoding the received data bit stream DBS if the calculated current synchronization confidence level SYNC-CL is equal or higher than the adjusted set synchronization confidence level SET-SYNC-CL. In a further possible embodiment of the method according to the first aspect of the present invention, the calculated current synchronization confidence level can also be output via a output data interface to an external control unit.

Figure 2:
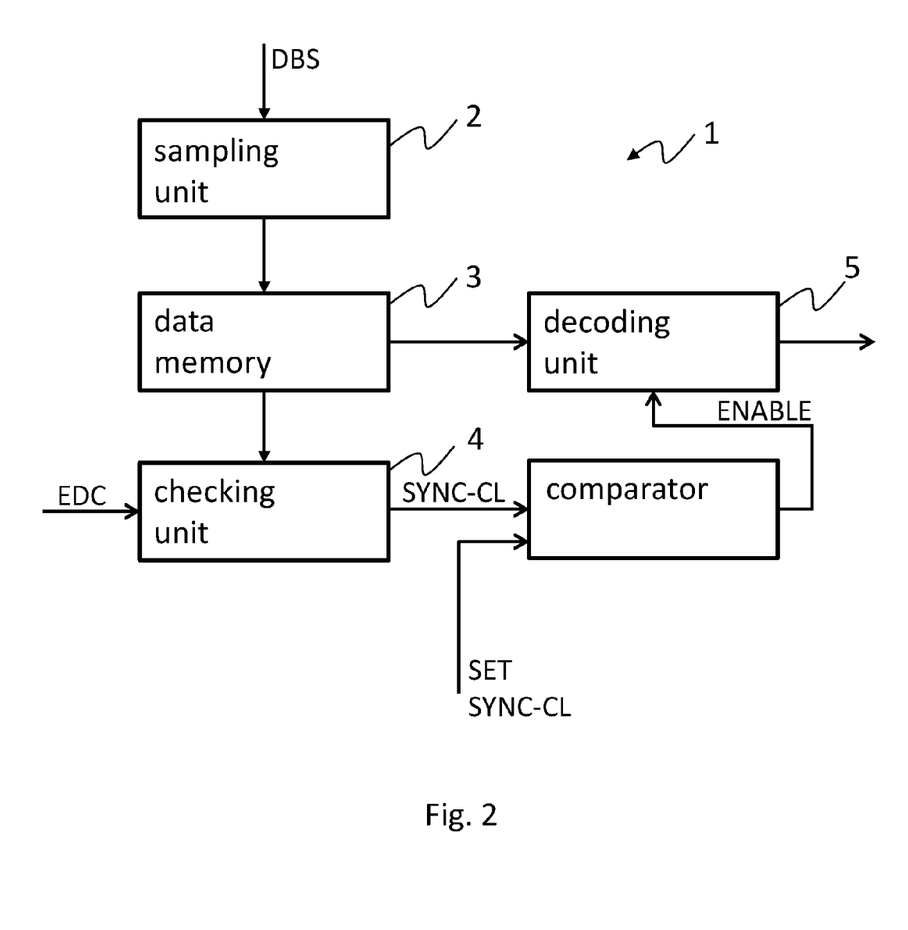
FIG. 2 shows a block diagram of a possible exemplary embodiment of an apparatus for synchronization of a decoding unit to a received data bit stream according to the second aspect of the present invention.

FIG. 2 shows a block diagram of an exemplary embodiment of an apparatus for synchronization of a decoding unit to a received data bit stream according to the second aspect of the present invention.

As shown in FIG. 2, a sampling unit 2 of the apparatus 1 is adapted to sample a bit sequence BSEQ having a predetermined bit sequence length BSEQL from the received data bit stream DBS and store the sampled bit sequence BSEQ in a data memory 3 of the apparatus 1.

The apparatus 1 further comprises a checking unit 4 configured to check whether at least one specific bit of the sampled bit sequence BSEQ stored in the data memory 4 fulfills a predetermined error detection condition EDC defined by the data protocol DP. The checking unit 4 is further configured in a possible embodiment to synchronize a decoding unit 5 to the received data bit stream DBS if the checking result is positive. In a possible implementation, the checking unit 4 is configured to check beginning with a first bit of the sampled bit sequence every n-th data bit of the bit sequence BSEQ as to whether it fulfills the predetermined error detection condition EDC defined by the data protocol DP, wherein n is the number of data bits of a data protocol character DP-CH defined by the respective data protocol DP.

In a possible embodiment, the error detection condition EDC comprises a predetermined parity error detection condition PEDC as defined by the data protocol DP. In a possible embodiment, the error detection condition EDC can be input to the checking unit 4 as illustrated in FIG. 2. In a possible embodiment, the checking unit 4 is configured to repeat iteratively in a sequence of iteration steps the checking of every n-th data bit of the sampled bit sequence BSEQ stored in the data memory 4 as long as the checked n-th data bit fulfills the predetermined error detection condition EDC defined by the data protocol DP. In a possible implementation, the checking unit 4 comprises an integrated counter which is configured to count the number N of checked iteration steps. The checking unit 4 is adapted to detect a sequence of N valid data protocol characters DP-CH within the sampled bit sequence BSEQ if the number N of counted checked iteration steps counted by said counter reaches a predetermined set threshold count value. The decoding unit 5 is then synchronized to the detected sequence of valid data protocol characters DP-CH if a current synchronization confidence level SYNC-CL reaches a set synchronization confidence level SET-SYNC-CL.

In the embodiment illustrated in FIG. 2, the checking unit 4 is further configured to calculate the current synchronization confidence level SYNC-CL. In a possible embodiment, the current synchronization confidence level SYCN-CL is calculated by the checking unit 4 as follows:

$$SYNC - CL = \frac{2^N - 1}{2^N},$$

wherein N is the number of valid data protocol characters detected in N successful check iteration steps performed by the checking unit 4.

Figure 4:
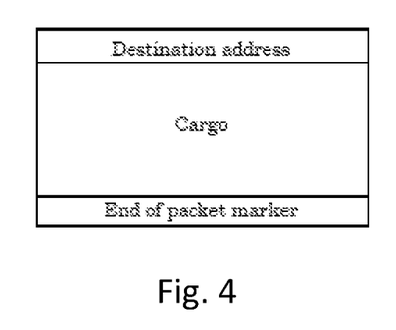
FIG. 4 shows a diagram for illustrating the data structure of a possible exemplary data packet transmitted by an exemplary data protocol.

In the embodiment illustrated in FIG. 4, the current synchronization confidence level SYNC-CL calculated by the checking unit 4 is output by the checking unit 4 to a comparator 6 adapted to enable the decoding unit 5 if the calculated current synchronization confidence level SYNC-CL reaches the set synchronization confidence level SET-SYNC-CL. The calculated synchronization confidence level SYNC-CL output by the processing unit 4 can be supplied in a possible embodiment internally to a higher protocol layer of a protocol stack or to an application of a higher protocol layer. In a still further possible embodiment, the current synchronization confidence level output by the checking unit 4 can be output via a data interface of the apparatus 1 to an external control unit for further processing.

In a possible embodiment of the apparatus 1, the sampling unit 2 is configured to sample a bit sequence BSEQ having a predetermined bit sequence length BSEQL from a spacewire data bit stream encoded according to the spacewire data protocol SpWDP. In a possible embodiment, the spacewire data protocol SpWDP can be used in a data handling network. The spacewire data protocol comprises some specific characters that support data handling applications allowing high speed data transmission with relatively low power and low complexity. In a possible embodiment, the data rate of the received data bit stream DBS can range between 2 Mbit/s to 200 Mbit/s. The data bit stream DBS received by the sampling unit 2 can be transported in a bidirectional full-duplex data link. The spacewire data protocol comprises in a possible embodiment into six layers. The physical layer defines connectors, cables, and cable assemblies. The signal layer of the spacewire protocol SpWDP defines encoding, voltage levels, noise margins and signaling rates. The character layer of the spacewire data protocol SpWDP defines the data and control characters used to manage data across a data link. The exchange layer of the spacewire protocol SpWDP defines the protocol for link initialization, flow control, link error detection and link error recovery. The packet layer of the spacewire data protocol manages data packetization and transmission over a spacewire link. Finally, the network layer of the spacewire protocol SpWDP defines the structure of a spacewire network and source to destination data transfers within the network.

Figure 3:
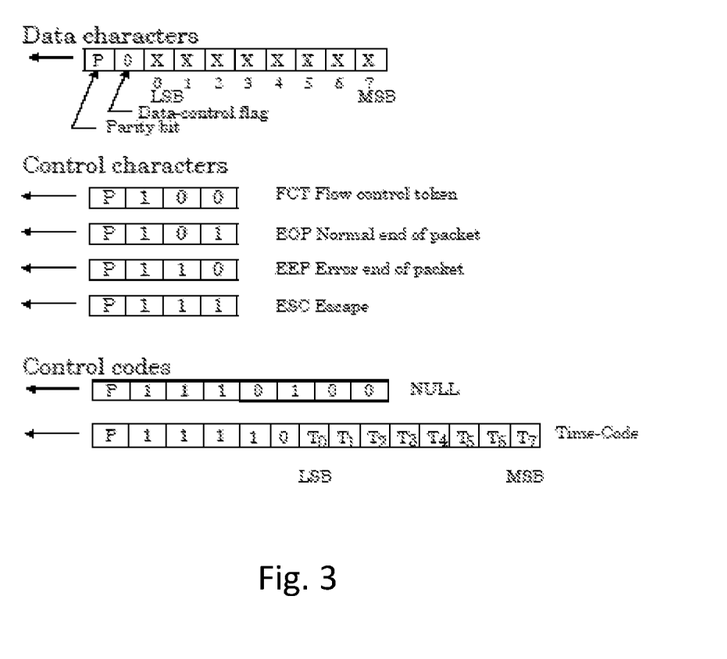
FIG. 3 shows a diagram for illustrating possible exemplary data structures of a data protocol which can be used by a method and apparatus according to the present invention for synchronization of a decoding unit.

FIG. 3 illustrates data and control characters according to the character level of the spacewire protocol SpWDP. Data protocol characters DP-CH of the spacewire data protocol SpWDP comprise different types of data protocol characters DP-CH. A first type of data protocol characters DP-CH comprises control characters consisting of a first number of data bits. The second type of data protocol characters DP-CH of the spacewire protocol comprises data characters consisting of a second number of data bits.

In a possible embodiment, the data characters hold an eight-bit data value, wherein the least significant data bit is transmitted first. Each data character contains a parity bit, a data-control flag and eight bits of data. The parity bit covers the previous eight bits of a data character or two bits of a control character, the current parity bit and the current data-control flag. The parity bit is set to produce odd parity so that the total number of high logic bits in the field covered is an odd number. The data control flag is set to zero to indicate that the current character is a data character.

The control characters of the spacewire data protocol SpWDP hold two control bits. Each control character is formed from a parity bit, a data-control flag and two control bits. The data-control flag is set to one to indicate that the current character is a control character. Parity coverage is similar to that for a data character. One of the four possible control characters is the escape code (ESC). This can be used to form control codes. Two control codes are specified and valid which are the NULL code and the Time-Code.

NULL is formed from the escape code ESC followed by a flow control token FCT. NULL is transmitted whenever a link is not sending data or control tokens to keep the link active and to support link disconnect detection.

The Time-Code is used to support the distribution of system time across a network. The Time-Code can be formed by the escape code ESC followed by a single data character.

At the exchange level of the spacewire data protocol SpWDP as defined in IEEE Standard 1355-1995 the initialization can be performed. Following a reset, the link output is held in the reset state until it is instructed to start and attempts to make a connection with the link interface at the other end of the data link. A connection can be made following a handshake that ensures both ends of the link are able to send and receive characters successfully. Each end of the link sends NULLs and waits to receive a NULL, then sends flow control tokens FCTs and waits to receive an FCT. Since a data link interface cannot send flow control tokens until it has received a NULL, reset of one or more NULLs followed by a reset of an FCT means that the other end of the link has received NULLs successfully and that full connection is achieved.

Parity errors occurring during transfer of data or control characters are detected when the next character is sent, since the parity bit for a data or control character is contained in the next character according to the spacewire data protocol SpWDP. If a parity error is detected the link can attempt to recover from the detected error.

FIG. 4 illustrates schematically a packet data format which can be used by the spacewire data protocol SpWDP as defined in IEEE Standard 1355-1995. The destination address illustrated in FIG. 8 is a list of zero or more data characters that represents the destination identity. The cargo of the data packet comprises the data to transfer from a source unit to a destination unit. The end of packet marker EOP is used to indicate the end of the data packet.

Figure 5:
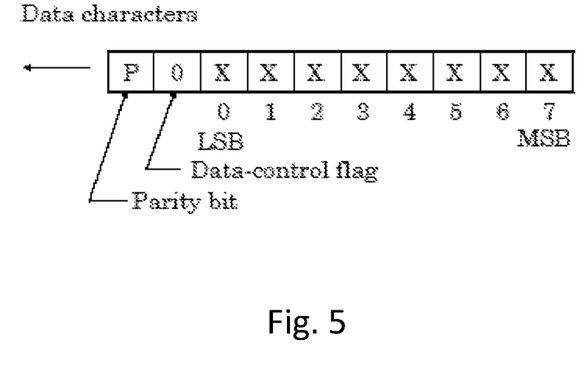
FIG. 5 shows the data structure of an exemplary data character as employed by a spacewire data protocol.

FIG. 5 illustrates a data character as used in the spacewire protocol SpWDP which contains a parity bit, a data control flag and eight bits of data. The data control flag can be set to zero to indicate that the current character is a data character.

Figure 6:
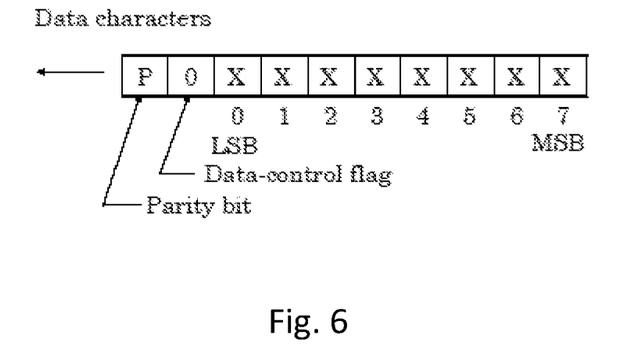
FIG. 6 shows schematically a parity coverage as employed by a spacewire data protocol.

FIG. 6 illustrates the parity coverage as employed by the spacewire data protocol SpWDP. The parity bit is assigned to each data or control character to support the detection of transmission errors. The parity bit covers in a possible embodiment the previous eight bits of a data character or two bits of a control character, the current parity bit and the current data control flag. The parity bit is set to produce odd parity so that the total number of logical high bits in the field covered is an odd number.

In the method and apparatus according to the present invention, the parity bits PBs carried in the characters DP-CH of the data bit stream DBS are not only used for transmission error detection, but also for fast synchronization of the decoding unit. The checking unit 4 of the apparatus 1 according to the second aspect of the present invention is configured to check beginning with the first bit of the sampled bit sequence BSEQ every n-th data bit of the received bit sequence as to whether it fulfills a predetermined parity condition PEPC as defined by the spacewire data protocol SpWDP, wherein N is the number of data bits of a data protocol character DP-CH defined by the spacewire protocol SpWDP. In a possible implementation, the used spacewire data protocol comprises at least two different types of data protocol characters. The first type of spacewire data protocol characters DP-CH comprises control characters CTRL-DP-CH consisting of $n_1=4$ data bits. The second type of data protocol characters DP-CH of the used spacewire protocol SpWDP comprises data characters DATA-DP-CH consisting of $n_2=10$ data bits. In a possible implementation, the checking unit 4 needs a random sequence of the received spacewire data bit stream DBS comprising at least $(N+1) \times 10$ bits, wherein N comprises the search steps that determines the synchronization confidence level SYNC-CL. The received data bit stream DBS is scanned according to the navigation rules provided by the spacewire data protocol SpWDP. Beginning with the first bit, at every fourth or tenth bits depending on the character type a parity bit PB can be found. In a possible embodiment, the parity bit PB is checked on its validity. If the parity is violated the checking is repeated with the next available bit of the sampled data bit stream DBS. If the parity bit PB is valid, the search path comprises a candidate for a synchronization and the method navigates to the next potential parity bit PB. In a possible embodiment, the checking unit 4 is configured to repeat iteratively in a sequence of iteration steps the checking of every n-th data bit of the sampled bit sequence as long as the checked n-th data bit fulfills the predetermined parity condition PEDC defined by the spacewire data protocol SpWDP. A counter counts the number N of checked iteration steps. The number N defines the confidence level of the performed synchronization. The calculated confidence level can be calculated from the iteration steps N as follows:

$$SYNC-CL = \frac{2^N - 1}{2^N},$$

wherein N is the number of valid data protocol characters DP-CH detected in N successful check iteration steps performed by the checking unit. For example, ten successful iteration steps create a confidence level of 1023/1024=99.9%. To achieve this confidence level SYNC-CL a scan maximum of 110 bits×10 times=1100 is needed. Due to the signal specification, an ambiguity may remain for characters starting within the first ten bits of the received data bit stream DBS. In a possible embodiment, the probability of error can be reduced by checking for a pattern of frequent null frames and favoring them over a data word.

In a possible embodiment, the apparatus 1 as shown in the embodiment of FIG. 4 can be integrated in a spacewire protocol decoder of a receiving unit. In a further possible embodiment, the synchronization apparatus 1 can be integrated into an oscilloscope for synchronization of a decoding unit to a received spacewire data bit stream DBS applied to an inport of said oscilloscope. In a possible embodiment of the oscilloscope, the oscilloscope can comprise a digital oscilloscope having a sampling unit 2 adapted to sample a bit sequence BSEQ with the predetermined bit sequence length BSEQL from the received spacewire data bit stream DBS. The sampled bit sequence can be stored in a data memory 4 of the oscilloscope. A processing unit with an integrated checking unit 4 can have access to the sampled data memory 4 of the oscilloscope 1. The checking unit 4 of the oscilloscope can be configured to check or analyze whether at least one specific bit of the sampled bit sequence BSEQ stored in the data memory 4 fulfills a predetermined error detection condition EDC in particular a parity error detection condition PEDC as defined by the data protocol DP. The checking unit 4 of the oscilloscope can be further configured to synchronize a decoding unit of the oscilloscope to the received data bit stream DBS if the checking result provided by the checking unit 4 is positive. The checking unit 4 of the oscilloscope can be configured to check beginning with a first bit of the sampled bit sequence BSEQ stored in the data memory every n-th data bit of the stored data bit sequence, as to whether it fulfills a predetermined error detection condition EDC defined by the data protocol, wherein N is the number of data bits of the spacewire data protocol SpWDP. In a possible embodiment, the oscilloscope according to the third aspect of the present invention can comprise an output unit configured to output the decoded data bit stream DBS and/or the calculated current synchronization confidence level SYNC-CL. The output unit can comprise an output data interface and/or a display unit. In a possible embodiment, a user of the oscilloscope can select a specific data protocol DP from a group of available stored data protocols. In a possible embodiment, a user can select via the user interface the spacewire data protocol SpWDP for decoding. In a further possible embodiment, the user or control unit can select a synchronization operation mode, wherein in a first synchronization mode the synchronization is performed using the method according to first aspect of the present invention, i.e. fast synchronization, and wherein in a second synchronization mode a conventional relatively slow synchronization is performed using the definitions of the spacewire data protocol.

The invention further provides according to a further aspect a receiver of a network node using the spacewire data protocol, wherein the receiver comprises a spacewire protocol decoder including the synchronization apparatus according to the second aspect of the present invention.

The invention further provides according to a further aspect a network comprising network nodes connected via transmission links and employing the spacewire data protocol SpWDP for encoding data bit streams DBS, wherein each node comprises a receiver having a spacewire protocol decoder having a synchronization apparatus according to the second aspect of the present invention.

The method and apparatus according to the present invention can be used in a wide range of applications for different networks and/or systems. The method and apparatus can be used by a measurement device, in particular by time-domain measurement instruments for measuring the transmission of data bit streams DBS via data links from a transmitting unit to a receiving unit. The method and apparatus according to the present invention can be used in any kind of oscilloscope and/or signal analyzing apparatus.

The invention claimed is:
1. A method for synchronization of a decoding unit to a received data bit stream, DBS, encoded according to a data protocol, DP, the decoding unit implemented on one or more processing units comprising circuitry, the method comprising the steps of:
   (a) sampling, by the one or more processing units, a bit sequence, SEQ, having a predetermined bit sequence length, BSEQL, from the received data bit stream, DBS;
   (b) checking, by the one or more processing units, whether at least one specific bit of the sampled bit sequence, BSEQ, fulfills a predetermined error detection condition, EDC, defined by said data protocol, DP, wherein beginning with the first bit of the sampled bit sequence, BSEQ, every n-th data bit of said bit sequence, BSEQ, is checked as to whether it fulfills the predetermined error detection condition, EDC, defined by said data protocol, DP, wherein n is the number of data bits of a data protocol character, DP-CH, defined by said data protocol, DP, and wherein checking of every n-th data bit of the sampled bit sequence, BSEQ, is repeated iteratively in a sequence of iteration steps as long as the checked n-th data bit fulfills the predetermined error detection condition, EDC, defined by the data protocol, DP, and wherein the number N of check iteration steps is counted, and wherein if the number, N, of counted check iteration steps reaches a predetermined threshold value, a sequence of N valid data protocol characters, DP-CH, within the sampled bit sequence, BSEQ, is detected; and
   (c) synchronizing, by the one or more processing units, the decoding unit to the received data bit stream, DBS, according to the checking result, wherein the decoding unit is synchronized to the detected sequence of valid data protocol characters, DP-CH, if a current synchronization confidence level, SYNC-CL, reaches a set synchronization confidence level, SYNC-CLSET, and wherein the current synchronization confidence level, SYNC-CL, is calculated by a checking unit, implemented on the one or more processing units, as follows:

$$SYNC-CL = \frac{2^N - 1}{2^N}$$

wherein N is the number of valid data protocol characters detected in N successful check iteration steps.

2. The method according to claim 1, wherein the error detection condition, EDC, comprises a parity error detection condition, PEDC, defined by said data protocol, DP.

3. The method according to claim 1, wherein the used data protocol, DP, comprises a continuous serial data transfer protocol.

4. The method according to claim 1, wherein the received data bit stream, DBS, comprises a spacewire data bit stream, SpWDBS, encoded according to the spacewire data protocol, SpWDP.

5. The method according to claim 1, wherein the data protocol characters, DP-CH, defined by said data protocol, DP, comprise different types of data protocol characters, DP-CH.

6. The method according to claim 5, wherein a first type of data protocol characters, DP-CH1, comprises control characters consisting of a first number n1 of data bits and a second type of data protocol characters, DP-CH2, comprises data characters consisting of a second number n2 of data bits.

7. The method according to claim 1, wherein the decoding unit decodes the received data bit stream after its synchronization in a decoding process comprising one or several decoding process steps defined by the data protocol, DP.

8. The method according to claim 1, wherein the current synchronization confidence level, SYNC-CL, is output by the checking unit, internally to a higher protocol layer of a protocol stack and/or to a comparator adapted to enable the decoding unit and/or via an output data interface to a control unit.

9. The method according to claim 1, wherein the sampled bit sequence, BSEQ, of the received data bit stream, DBS, is stored in a data memory and read from the data memory by the checking unit which checks whether at least one specific bit of the sampled bit sequence, BSEQ, fulfills the predetermined error detection condition, EDC, defined by said data protocol, DP.

10. The method according to claim 1, wherein the data protocol is selected by a user or by a control unit from a predetermined group of available data protocols, DPs.

11. An apparatus for synchronization of a decoding unit to a received data bit stream, DBS, encoded according to a data protocol, DP, said apparatus comprising one or more processing units implemented in circuitry, the one or more processing units comprising: the decoding unit, a sampling unit, and a checking unit:
   (a) wherein the sampling unit is adapted to sample a bit sequence, BSEQ, having a predetermined bit sequence length, BSEQL, from the received data bit stream, DBS, and
   (b) wherein the checking unit is:
      configured to check whether at least one specific bit of the sampled bit sequence, BSEQ, fulfills a predetermined error detection condition, EDC, defined by said data protocol, DP, and
      further configured to synchronize the decoding unit to the received data bit stream, DBS, if the checking result is positive, wherein the checking unit is configured to check beginning with a first bit of the sampled bit sequence, BSEQ, every n-th data bit of said bit sequence, BSEQ, as to whether it fulfills the predetermined error detection condition, EDC, defined by the data protocol, DP, wherein n is the number of data bits of a data protocol character, DP-CH, defined by said data protocol, DP, and wherein the decoding unit is synchronized to the detected sequence of valid data protocol characters, DP-CH, if a current synchronization confidence level, SYNC-CL, reaches a set synchronization confidence level, SYNCCLSET, and wherein the checking unit is configured to calculate the current synchronization confidence level, SYNC-CL, as follows:

$$SYNC-CL = \frac{2^N - 1}{2^N}$$

wherein N is the number of valid data protocol characters detected in N successful check iteration steps performed by said checking unit.

12. The apparatus according to claim 11, wherein the received data bit stream, DBS, comprises a spacewire data bit stream, SpWDBS, encoded according to the spacewire data protocol, SpWDP.

13. The apparatus according to claim 12, wherein the data protocol characters, DP-CH, of the spacewire data protocol, SpWDP, comprise different types of data protocol characters, DP-CH, wherein a first type of data protocol characters, DPCH1, comprises control characters consisting of a first number n1 of data bits and a second type of data protocol characters, DP-CH2, comprises data characters consisting of a second number n2 of data bits.

14. The apparatus according to claim 11, wherein the checking unit is configured to repeat iteratively in a sequence of iteration steps the checking of every nth data bit of the sampled bit sequence as long as the checked n-th data bit fulfills the predetermined error detection condition, EDC, defined by the data protocol, DP.

15. The apparatus according to claim 14, wherein the checking unit comprises a counter which is configured to count the number N of check iteration steps.

16. The apparatus according to claim 15, wherein the checking unit is adapted to detect a sequence of N valid data protocol characters, DP-CH, within the sampled bit sequence, BSEQ, if the number N of counted check iteration steps counted by the counter of the checking unit reaches a predetermined threshold value.

17. The apparatus according to claim 11 wherein the calculated current synchronization confidence level, SYNC-CL, is output by said checking unit internally to a higher protocol layer of a protocol stack and/or to a comparator adapted to enable the decoding unit and/or via an output data interface to a control unit.

18. The apparatus according to claim 11, wherein the sampled bit sequence, BSEQ, of the received data bit stream, DBS, is stored in a data memory and read from said data memory by a checking unit which is configured to check whether at least one specific bit of the sampled bit sequence, BSEQ, fulfills the predetermined error detection condition, EDC, defined by said data protocol, DP.

19. The apparatus according to claim 11, wherein the data protocol, DP, is selected by a user or by a control unit from a predetermined group of available data protocols, DPs, wherein the control unit is external to the processing unit.

20. An oscilloscope comprising an apparatus for synchronization of a decoding unit to a received data bit stream, DBS, encoded according to a data protocol, DP, said apparatus comprising one or more processing unit implemented in circuitry, the one or more processing units comprising: the decoding unit, a sampling unit, and a checking unit:

(a) wherein the sampling unit is adapted to sample a bit sequence, BSEQ, having a predetermined bit sequence length, BSEQL, from the received data bit stream, DBS, and (b) wherein the checking unit is:
configured to check whether at least one specific bit of the sampled bit sequence, BSEQ, fulfills a predetermined error detection condition, EDC, defined by said data protocol, DP, and
further configured to synchronize the decoding unit to the received data bit stream, DBS, if the checking result is positive, wherein the checking unit is configured to check beginning with a first bit of the sampled bit sequence, B SEQ, every n-th data bit of said bit sequence, BSEQ, as to whether it fulfills the predetermined error detection condition, EDC, defined by the data protocol, DP, wherein n is the number of data bits of a data protocol character, DP-CH, defined by said data protocol, DP, and wherein the decoding unit is synchronized to the detected sequence of valid data protocol characters, DP-CH, if a current synchronization confidence level, SYNC-CL, reaches a set synchronization confidence level, SYNC-CLSET, and wherein the checking unit is configured to calculate the current synchronization confidence level, SYNC-CL, as follows:

$$SYNC-CL = \frac{2^N - 1}{2^N}$$

wherein N is the number of valid data protocol characters detected in N successful check iteration steps performed by said checking unit.

21. The oscilloscope according to claim 20, the oscilloscope further comprising an output unit configured to output the decoded data bit stream, DBS, and/or the calculated current synchronization confidence level, SYNC-CL, output by the apparatus.

22. A spacewire protocol decoder comprising a synchronization apparatus for synchronization of a decoding unit to a received data bit stream, DBS, encoded according to a data protocol, DP, said apparatus comprising one or more processing units implemented in circuitry, the one or more processing units comprising: the decoding unit, a sampling unit, and a checking unit:

(a) wherein the sampling unit is adapted to sample a bit sequence, BSEQ, having a predetermined bit sequence length, BSEQL, from the received data bit stream, DBS, and (b) wherein the checking unit is:
configured to check whether at least one specific bit of the sampled bit sequence, BSEQ, fulfills a predetermined error detection condition, EDC, defined by said data protocol, DP, and
further configured to synchronize the decoding unit to the received data bit stream, DBS, if the checking result is positive, wherein the checking unit is configured to check beginning with a first bit of the sampled bit sequence, BSEQ, every n-th data bit of said bit sequence, BSEQ, as to whether it fulfills the predetermined error detection condition, EDC, defined by the data protocol, DP, wherein n is the number of data bits of a data protocol character, DP-CH, defined by said data protocol, DP, and wherein the decoding unit is synchronized to the detected sequence of valid data protocol characters, DP-CH, if a current synchronization confidence level, SYNC-CL, reaches a set synchronization confidence level, SYNCCLSET, and wherein the checking unit is configured to calculate the current synchronization confidence level, SYNC-CL, as follows:

$$SYNC-CL = \frac{2^N - 1}{2^N}$$

wherein N is the number of valid data protocol characters detected in N successful check iteration steps performed by said checking unit.

* * * * *